United States Patent
Kim

(10) Patent No.: US 9,865,634 B2
(45) Date of Patent: Jan. 9, 2018

(54) IMAGE SENSOR WITH A RESET TRANSISTOR HAVING SPONTANEOUS POLARIZATION CHARACTERISTCS AND METHOD FOR OPERATING THE SAME

(71) Applicant: SK hynix Inc., Gyeonggi-do (KR)

(72) Inventor: Do-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 404 days.

(21) Appl. No.: 14/566,409

(22) Filed: Dec. 10, 2014

(65) Prior Publication Data

US 2016/0093654 A1   Mar. 31, 2016

(30) Foreign Application Priority Data

Sep. 29, 2014   (KR) .................. 10-2014-0129840

(51) Int. Cl.
| | |
|---|---|
| H01L 27/146 | (2006.01) |
| H04N 5/374 | (2011.01) |
| H04N 5/359 | (2011.01) |
| H01L 29/51 | (2006.01) |

(52) U.S. Cl.
CPC ...... *H01L 27/14614* (2013.01); *H01L 29/513* (2013.01); *H01L 29/516* (2013.01); *H01L 29/518* (2013.01); *H04N 5/3597* (2013.01); *H04N 5/374* (2013.01)

(58) Field of Classification Search
CPC ......... H01L 27/14614; H01L 27/14612; H01L 27/14609; H01L 29/518; H01L 29/513; H01L 29/516; H04N 5/374; H04N 5/3741; H04N 5/3597

USPC ....... 250/208.1, 214.1, 214 R; 257/257, 258, 257/290, 291, 292; 348/308, 302
See application file for complete search history.

(56) References Cited

U.S. PATENT DOCUMENTS

| | | | | |
|---|---|---|---|---|
| 5,808,676 | A * | 9/1998 | Biegelsen ............ | G11C 27/024 257/233 |
| 6,707,410 | B1 * | 3/2004 | Bock ................. | G11C 7/06 327/65 |
| 6,777,662 | B2 * | 8/2004 | Drowley ............ | H04N 5/35527 250/208.1 |
| 2004/0174754 | A1 * | 9/2004 | Lee .................. | H04N 3/15 365/200 |
| 2005/0151175 | A1 * | 7/2005 | Ohkawa ............ | H01L 27/14601 257/292 |
| 2006/0102827 | A1 * | 5/2006 | Kasuga ............. | H01L 27/14609 250/208.1 |
| 2010/0224916 | A1 * | 9/2010 | Shimizu ............ | H01L 21/28176 257/288 |
| 2013/0321685 | A1 | 12/2013 | Ahn et al. | |
| 2015/0145096 | A1 * | 5/2015 | Hsu .................. | H01L 27/1464 257/460 |

* cited by examiner

*Primary Examiner* — Que T Le
*Assistant Examiner* — Jennifer Bennett
(74) *Attorney, Agent, or Firm* — IP & T Group LLP

(57) ABSTRACT

An image sensor includes a photoelectric conversion element suitable for generating photocharges corresponding to incident light, a transfer transistor suitable for transferring the generated photocharges to a floating diffusion node based on a transfer signal, and a reset transistor suitable for resetting the floating diffusion node based on a reset signal and including a memory gate.

22 Claims, 2 Drawing Sheets

IMAGE SENSOR WITH A RESET TRANSISTOR HAVING SPONTANEOUS POLARIZATION CHARACTERISTCS AND METHOD FOR OPERATING THE SAME

CROSS-REFERENCE TO RELATED APPLICATIONS

The present application claims priority of Korean Patent Application No. 10-2014-0129840, filed on Sep. 29, 2014, which is incorporated herein by reference in its entirety.

BACKGROUND

1. Field

Exemplary embodiments of the present invention relate to a semiconductor device fabrication technology, and more particularly, to an image sensor and a method for operating the image sensor.

2. Description of the Related Art

Image sensors transform optical images into electrical signals. Recently, image sensors have been incorporated in diverse applications such as digital cameras, camcorders, personal communication systems, game players, cameras for security purposes, micro-cameras for medical purposes, robots and so forth.

SUMMARY

Various embodiments of the present invention are directed to an image sensor with improved performance, and a method for operating the same.

In accordance with an embodiment of the present invention, an image sensor may include: a photoelectric conversion element suitable for generating photocharges corresponding to incident light; a transfer transistor suitable for transferring the generated photocharges to a floating diffusion node based on a transfer signal; and a reset transistor suitable for resetting the floating diffusion node based on a reset signal, wherein the reset transistor includes a memory gate.

The memory gate may maintain a turn-on state or a turn-off state of the reset transistor while in equilibrium. The memory gate may include a stacked structure where a gate dielectric layer and a gate electrode are stacked, and the gate dielectric layer may include a ferroelectric substance having spontaneous polarization characteristics. The memory gate may include a stacked structure where a tunnel insulation layer, a charge trapping layer, a charge blocking layer, and a gate electrode are sequentially stacked, and the charge trapping layer may include a silicon layer or a nitride layer. The memory gate may turn on the reset transistor based on a first reset pulse of the reset signal, which is applied at a beginning period of a predetermined operation section, and turns off the reset transistor based on a second reset pulse of the reset signal, which is applied at an ending period of the predetermined operation section, and the reset transistor may be kept in the turn-on state during the predetermined operation section. The predetermined operation section may include an integration section for the photoelectric conversion element. The first reset pulse may have a positive voltage level, and the second reset pulse may have a negative voltage level.

In accordance with an embodiment of the present invention, an image sensor may include: a photoelectric conversion element suitable for generating photocharges corresponding to incident light; a transfer transistor suitable for transferring the photocharges to a floating diffusion node based on a transfer signal; and a reset transistor suitable for resetting the floating diffusion node based on a reset signal, wherein the reset transistor includes a gate dielectric layer having spontaneous polarization characteristics, where a direction of spontaneous polarization of the gate dielectric layer is changed based on the reset signal.

The image sensor may further include a drive transistor having a gate that is electrically connected to the floating diffusion node. A gate dielectric layer of the drive transistor and a gate dielectric layer of the transfer transistor may not have spontaneous polarization characteristics. A turn-on state or a turn-off state of the reset transistor is kept in an equilibrium state according to the direction of the spontaneous polarization. The reset transistor may be turned on as the direction of the spontaneous polarization of the gate dielectric layer is changed based on a first reset pulse of the reset signal, which is applied at a beginning period of a predetermined operation section, and the reset transistor may be turned off as the direction of the spontaneous polarization of the gate dielectric layer is changed to an opposite direction based on a second reset pulse of the reset signal, which is applied at an ending period of the predetermined operation section, and the reset transistor may be kept in the turn-on state based on the spontaneous polarization characteristics during the predetermined operation section. The predetermined operation section may include an integration section for the photoelectric conversion element. The first reset pulse may have a positive voltage level, and the second reset pulse may have a negative voltage level.

In accordance with an embodiment of the present invention, a method for operating an image sensor that includes a photoelectric conversion element suitable for generating photocharges corresponding to incident light, a transfer transistor suitable for transferring the photocharges to a floating diffusion node, and a reset transistor suitable for resetting the floating diffusion node and a memory gate, the method including: turning on the reset transistor by applying a first reset pulse to the memory gate in a first section; integrating the incident light into the photoelectric conversion element during a second section following the first section, and turning off the reset transistor by applying a second reset pulse to the memory gate at an ending period of the second section; and turning on the transfer transistor by applying a transfer signal to a gate of the transfer transistor in a third section following the second section.

The memory gate may maintain a turn-on state or a turn-off state of the reset transistor in an equilibrium state. The reset transistor may be kept in the turn-on state during the second section. The first reset pulse and the second reset pulse may have different signal polarities. The first reset pulse and the second reset may have voltage levels whose absolute values are greater than an absolute value of a voltage level of the transfer signal. The memory gate may include a stacked structure where a gate dielectric layer and a gate electrode are stacked, and the gate dielectric layer includes a ferroelectric substance having spontaneous polarization characteristics. The memory gate may include a stacked structure where a tunnel insulation layer, a charge trapping layer, a charge blocking layer, and a gate electrode are sequentially stacked, and the charge trapping layer may include a silicon layer or a nitride layer.

DETAILED DESCRIPTION

Figure 1:
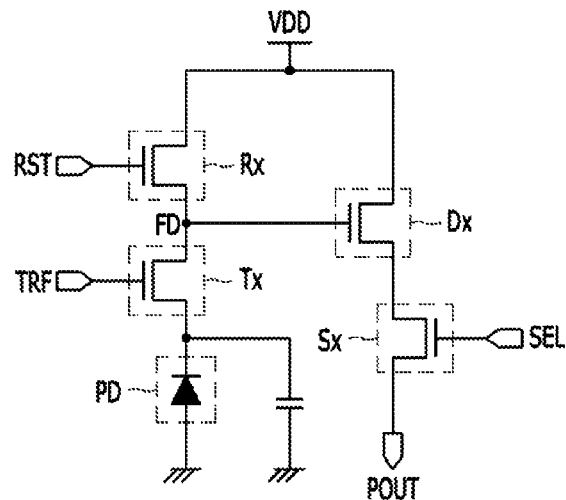
FIG. 1 is a circuit diagram illustrating a unit pixel of an image sensor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments of the present invention provides an image sensor with improved performance and a method for operating the image sensor. Herein, the image sensor is a device for transforming an optical image into electrical signals, and non-limiting examples of the image sensor include a charge-coupled device (CCD) and a complementary metal-oxide semiconductor (CMOS) image sensor. Particularly, the CMOS image sensor has the advantage of low production cost due to its simple operation scheme and compatibility with CMOS fabrication technology. A CMOS image sensor includes a pixel array where a plurality of unit pixels are arranged in two dimensions. Each of the unit pixels includes a photoelectric conversion element for generating photocharges from incident light, and pixel transistor for outputting a pixel signal corresponding to the generated photocharges. The unit pixel may be realized in diverse architectures by including two or more transistors. Generally, the pixel transistor is formed of four transistors. Described hereafter is a comparative example to be compared with the embodiment of the present invention. The comparative example describes a general unit pixel structure including a photoelectric conversion element and a pixel transistor including four transistors.

Figure 2:
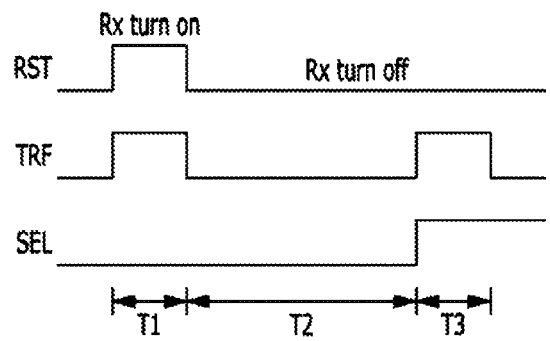
FIG. 2 is a timing diagram for describing an operation of the image sensor shown in FIG. 1.

FIG. 1 is a circuit diagram illustrating a unit pixel of an image sensor, and FIG. 2 is a timing diagram for describing an operation of the image sensor shown in FIG. 1.

Referring to FIGS. 1 and 2, the unit pixel of the image sensor may include a photoelectric conversion element PD, a transfer transistor Tx, a reset transistor Rx, a drive transistor Dx, and a selection transistor Sx. The drive transistor Dx may also be known as a source follower transistor.

The photoelectric conversion element PD may be a photodiodes One side of the photoelectric conversion element PD may be coupled with a ground. One side of the transfer transistor Tx, e.g., a source, may be coupled with the photoelectric conversion element PD, and the other side of the transfer transistor Tx, e.g., a drain, may be coupled with a floating diffusion node FD. The floating diffusion node FD may be coupled with one side of the reset transistor Rx. The other side of the reset transistor Rx may be coupled with a power source voltage terminal VDD. One side of the drive transistor Dx may also be coupled with the power source voltage terminal VDD. A drive gate of the drive transistor Dx may be coupled with the floating diffusion node FD. The other side of the drive transistor Dx may be coupled with one side of the selection transistor Sx, and a pixel signal POUT may be outputted through the other side of the selection transistor Sx.

In a first section T1, the transfer transistor Tx and the reset transistor Rx are turned on when a transfer signal TRF and a reset signal RST that are applied to gates of the transfer transistor Tx and the reset transistor Rx, respectively, are activated, while the incident light is blocked off. As the transfer transistor Tx and the reset transistor Rx are turned on, the floating diffusion node FD is reset as the charges remaining in the floating diffusion node FD are discharged. Herein, the transfer signal TRF and the reset signal RST may be pulse voltage signals that control a transistor to be turned on/off, and their signal intensities, which are voltage values, may be the same.

In a second section T2 following the first section T1, the light from the exterior, which is the incident light reflected by a subject, enters the photoelectric conversion element PD while the transfer transistor Tx and the reset transistor Rx are turned off. Due to the incident light, photocharges, which are electron-hole pairs (EHPs), are generated in the photoelectric conversion element PD, and the generated photocharges are accumulated in the photoelectric conversion element PD. Therefore, the second section T2 may be regarded as an integration section of the photoelectric conversion element PD.

In a third section T3 following the second section T2, the photocharges accumulated in the photoelectric conversion element PD are transferred to the floating diffusion node FD by applying the transfer signal TRF to the gate of the transfer transistor Tx and turning on the transfer transistor Tx. A gate bias of the drive transistor Dx is changed in proportion to the amount of the photocharges transferred and accumulated in the floating diffusion node FD, and the voltage level of the source of the drive transistor Dx is changed. Herein, when the selection transistor Sx is turned on by a selection signal SEL that is applied to the gate of the selection transistor Sx, the pixel signal POUT is outputted. The selection signal SEL may be a pulse voltage signal that controls a transistor to be turned on/off, and the signal intensity of the selection signal SEL, which is a voltage value, may be the same as those of the transfer signal TRF and the reset signal RST.

There is an issue with the unit pixel shown in FIG. 1 in that the photocharges remaining in the floating diffusion node FD may not be completely removed because the reset transistor Rx is kept on only in the first section T1 before the second section T2, which is the integration section of the photoelectric conversion element PD. This deteriorates the image lag and signal-to-noise ratio (SNR) characteristics because the voltage level of the floating diffusion node FD is changed in the integration section.

Generally, characteristic deterioration in CMOS image sensors has been improved by controlling operation timing of the pixel transistors.

Figure 3:
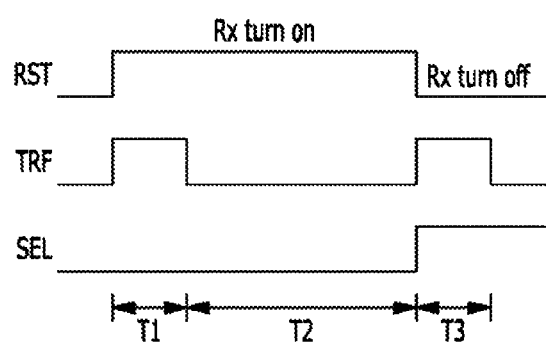
FIG. 3 is a timing diagram for describing an improved operation of the image sensor shown in FIG. 1.

FIG. 3 is a timing diagram for describing an improved operation of the image sensor shown in FIG. 1. Herein, descriptions on the same constituent elements appearing in the descriptions with reference to FIG. 2 are omitted.

Referring to FIGS. 1 and 3, the reset signal RST is continuously applied to the gate of the reset transistor Rx during a time corresponding to the first section T1 and the second section T2. In this way, the reset transistor Rx may continue to be turned on in the second section T2 as well as in the first section T1. In other words, as the reset transistor Rx continues to be turned on to the moment right before the photocharges accumulated in the photoelectric conversion element PD are transferred to the floating diffusion node FD, the photocharges remaining in the photoelectric conversion element PD may be completely removed, thus improving the image lag characteristics. Also, the signal-to-noise characteristics may be improved by preventing the voltage level of the floating diffusion node FD from being changed in the second section T2.

However, the improved operation method has a drawback of increased power consumption because the reset signal RST is continuously applied to the gate of the reset transistor Rx to keep the reset transistor Rx to turned on during the first section T1 and the second section T2. Also, since the reset signal RST is applied to the gate of the reset transistor Rx for a long time, noise may occur due to leakage between the floating diffusion node FD and the gate of the reset transistor Rx.

To resolve such concerns, the following embodiments of the present invention provides an image sensor with improved signal-to-noise and image lag characteristics as well as reduced power consumption. To this end, the image sensor in accordance with the embodiment of the present invention may include a reset transistor including a memory gate. The memory gate of the reset transistor controls the reset transistor to be turned on/off in response to a reset signal, and maintains the reset transistor in the turn-on/off state in an equilibrium state, which is a state free of external stimulus. The equilibrium state free of external stimulus means a state in which no reset signal is applied to the memory gate. In other words, although no reset signal is applied to the memory gate, the reset transistor may continue to be in the turn-on state or the turn-off state.

The memory gate that may maintain the reset transistor Rx in the turn-on state or the turn-off state may include a stacked structure where a gate dielectric layer and a gate electrode are stacked. The gate dielectric layer may include a ferroelectric substance having spontaneous polarization characteristics. Herein, the spontaneous polarization characteristics makes a transistor maintain a particular state, and the turn-on state or the turn-off state of the transistor may be decided based on the direction of the spontaneous polarization. Also, the memory gate may include a stacked structure where a tunnel insulation layer, a charge trapping layer, a charge blocking layer, and a gate electrode are sequentially stacked. The charge trapping layer may include a silicon oxide layer or a nitride layer, and the tunnel insulation layer and the charge blocking layer may include an oxide layer. With the charges captured inside of the charge trapping layer, the transistor may maintain a particular state, and the turn-on/off state of the transistor may be decided based on whether there is a charge in the inside of the charge trapping layer.

Figure 4:
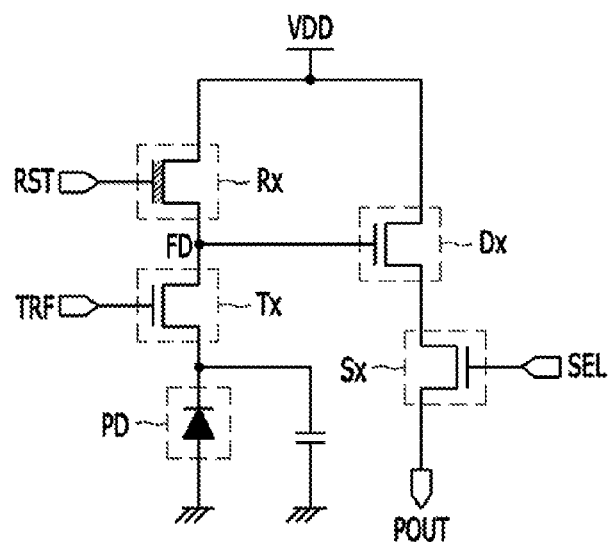
FIG. 4 is a circuit diagram illustrating a unit pixel of an image sensor in accordance with an embodiment of the present invention.
Figure 5:
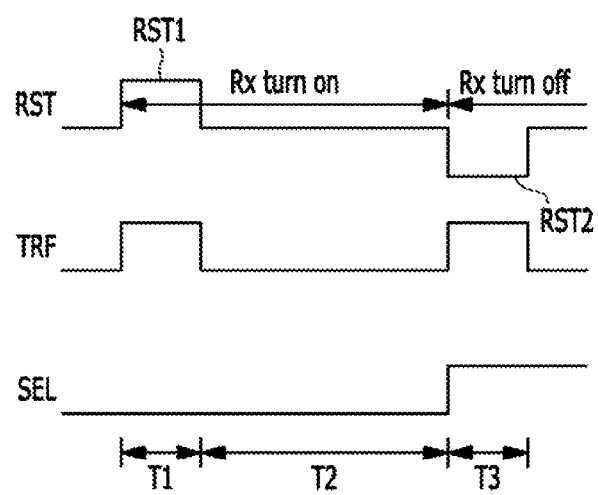
FIG. 5 is a timing diagram for describing an operation of the image sensor shown in FIG. 4.

Described hereafter are a unit pixel of the image sensor and an operation method thereof in accordance with an embodiment of the present invention with reference to FIGS. 4 and 5. In this embodiment of the present invention, a case where a gate dielectric layer of a reset transistor includes a ferroelectric substance having spontaneous polarization characteristics is described exemplarily.

FIG. 4 is a circuit diagram illustrating a unit pixel of an image sensor in accordance with an embodiment of the present invention, and FIG. 5 is a timing diagram for describing an operation of the image sensor shown in FIG. 4.

Referring to FIGS. 4 and 5, each unit pixel of the image sensor may include a photoelectric conversion element PD for generating photocharges, a transfer transistor Tx for transferring the photocharges from the photoelectric conversion element PD to a floating diffusion node FD, and a reset transistor Rx for resetting the floating diffusion node FD. Herein, the reset transistor Rx may include a gate dielectric layer having spontaneous polarization characteristics and its spontaneous polarization direction changed in response to a reset signal RST.

The photoelectric conversion element PD may be a photodiode. The photoelectric conversion element PD may include a plurality of photoelectric converters that are formed in a substrate to vertically overlap with each other. Each of the photoelectric converters may include an N-type impurity region and a P-type impurity region. One side of the photoelectric conversion element PD may be coupled with ground.

One side of the transfer transistor Tx, e.g., a source, may be coupled with the photoelectric conversion element PD, and the other side of the transfer transistor Tx, e.g., a drain, may be coupled with the floating diffusion node FD. The transfer transistor Tx may be controlled to be turned on or off in response to a transfer signal TRF applied to a gate of the transfer transistor Tx. The transfer signal TRF may be a pulse voltage signal, and the pulse width of the transfer signal TRF may be controlled according to the required turn-on time of the transfer transistor Tx. This is because the transfer transistor Tx may maintain the turn-on state only when the transfer signal TRF is applied to the transfer transistor Tx. For this reason, a gate dielectric layer of the transfer transistor Tx does not have spontaneous polarization characteristics. The gate dielectric layer of the transfer transistor Tx may be formed of the same material as or a different material from the gate dielectric layer of the reset transistor Rx. Although the gate dielectric layer of the transfer transistor Tx is formed of the same material as the gate dielectric layer of the reset transistor Rx, whether to have the spontaneous polarization characteristics may be controlled according to the forming method. When the gate dielectric layer of the transfer transistor Tx is formed of the same material as the gate dielectric layer of the reset transistor Rx, the gate dielectric layer of the reset transistor Rx may be formed thicker than the gate dielectric layer of the transfer transistor Tx.

The gate of the transfer transistor Tx may have diverse forms. For example, the gate of the transfer transistor Tx may be in the form of a recess gate, a saddle-fin gate, a buried gate, or a vertical gate.

The floating diffusion node FD may be coupled with one side of the reset transistor Rx, and the other side of the reset transistor Rx may be coupled with a power source voltage terminal VDD. Although this embodiment of the present invention shows a case where one reset transistor Rx is coupled with one transfer transistor Tx, more than two transfer transistors Tx may be coupled with the reset transistor Rx to improve the degree of integrations. In short, more than two unit pixels may share one reset transistor Rx.

The gate of the reset transistor Rx may be a memory gate. The memory gate may maintain the turn-on state or the turn-off state of the reset transistor Rx. To be specific, the memory gate may be of a stacked structure where a gate dielectric layer and a gate electrode are stacked. The gate dielectric layer may include a ferroelectric substance having spontaneous polarization characteristics. Non-limiting examples of the ferroelectric substance having spontaneous polarization characteristics may include HfTaO, HfSiO, $ZrO_2$, $Ta_2O_5$, and $Al_2O_3$. The gate dielectric layer may be a single layer of one selected from the group including HfTaO, HfSiO, $ZrO_2$, $Ta_2O_5$, and $Al_2O_3$, or a stacked layer of two or more of them.

The gate dielectric layer including a ferroelectric substance having spontaneous polarization characteristics may have its direction of spontaneous polarization changed in response to a reset signal RST applied to the gate of the reset transistor Rx. The turn-on state or the turn-off state of the reset transistor Rx may be decided based on the direction of the spontaneous polarization. The reset signal RST that changes the direction of the spontaneous polarization of the gate dielectric layer may be a pulse voltage signal. The reset signal RST may turn on the reset transistor Rx and may turn off the reset transistor Rx by varying signal polarities. For example, the reset signal RST may include a first reset pulse RST1 for turning on the reset transistor Rx and a second reset pulse RST2 for turning off the reset transistor Rx. The first reset pulse RST1 may have a positive voltage level, and a second reset pulse RST2 may have a negative voltage level. The absolute value of the signal intensity (i.e., a voltage level) of the reset signal RST may be greater than those of the signal intensities of the transfer signal TRF and the selection signal SEL. The pulse width of the reset signal RST may be controlled according to the characteristics of the memory gate.

The image sensor may include a drive transistor Dx whose gate is electrically connected to the floating diffusion node FD, and a selection transistor Sx. One side of the drive transistor Dx may be coupled with the power source voltage terminal VDD, and the other side of the drive transistor Dx may be coupled with one side of the selection transistor Sx. A pixel signal POUT may be outputted from the other side of the selection transistor Sx.

The drive transistor Dx may perform a driving operation with the power source voltage VDD according to the voltage level of the floating diffusion node FD that is caused by the transferred photocharges and the selection transistor Sx may be controlled to be turned on/off in response to the selection signal SEL. The selection signal SEL may be a pulse voltage signal, and the pulse width of the selection signal SEL may be controlled according to the required turn-on time of the selection signal SEL.

The drive transistor Dx and the selection transistor Sx may be the same transistors as the transfer transistor Tx. To be specific, the gate dielectric layer of the drive transistor Dx and the gate dielectric layer of the selection transistor Sx do not have spontaneous polarization characteristics. The gate dielectric layer of the drive transistor Dx and the gate dielectric layer of the selection transistor Sx may be formed of the same material as or a different material than the gate dielectric layer of the reset transistor Rx. Although the gate dielectric layer of the drive transistor Dx and the gate dielectric layer of the selection transistor Sx are formed of the same material as the gate dielectric layer of the reset transistor Rx, whether to have the spontaneous polarization characteristics may be controlled according to the forming method. When the gate dielectric layer of the drive transistor Dx and the gate dielectric layer of the selection transistor Sx are formed of the same material as the gate dielectric layer of the reset transistor Rx, the gate dielectric layer of the reset transistor Rx may be formed thicker than the gate dielectric layer of the drive transistor Dx and the gate dielectric layer of the selection transistor Sx.

Meanwhile, more than two unit pixels may share one drive transistor Dx or one selection transistor Sx to improve the degree of integration. Also, unit pixels may not be provided with selection transistors according to another embodiment of the present invention. When unit pixels do not include a selection transistor Sx, a pixel signal POUT may be outputted from the other side of the drive transistor Dx.

In a first section T1, the transfer transistor Tx and the reset transistor Rx are turned on when the transfer signal TRF and the first reset pulse RST1 that are applied to the gates of the transfer transistor Tx and the reset transistor Rx, respectively, are activated, while the incident light is blocked off. As the transfer transistor Tx and the reset transistor Rx are turned on, photocharges remaining in the floating diffusion node FD are discharged to reset the floating diffusion node FD. A voltage level of the first reset pulse RST1 may be greater than that of the transfer signal TRF. This is because the first reset pulse RST1 not only controls the turn-on or turn-off of the reset transistor Rx, but also changes the spontaneous polarization direction of the gate dielectric layer of the reset transistor Rx as well. For the sake of convenience, it is illustrated in the drawing that the pulse width of the transfer signal TRF is the same as the pulse width of the first reset pulse RST1, but the pulse width of the transfer signal TRF and the pulse width of the first reset pulse RST1 may be controlled individually according to required characteristics.

A second section T2 following the first section T1 is an integration section of the photoelectric conversion element PD. While the transfer transistor Tx is turned off, the incident light reflected from a subject enters the photoelectric conversion element PD to generate photocharges during the second section T2. The generated photocharges are accumulated in the photoelectric conversion element PD by the transfer transistor Tx which is in the turn-off state. Herein, since the spontaneous polarization direction of the gate dielectric layer of the reset transistor Rx is changed into a spontaneous polarization direction that turns on the reset transistor Rx in response to the first reset pulse RST1 in the first section T1, the reset transistor Rx may be kept in the turn-on state in the second section T2 although the reset signal RST is applied additionally. Therefore, it may be possible to prevent deterioration of image lag and SNR characteristics caused by the change in the voltage level of the floating diffusion node FD, while reducing overall power consumption. Also, noise caused by leakage between the memory gate and the floating diffusion node FD may be prevented from occurring.

At the ending period of the second section T2, the reset transistor Rx is turned off when a second reset pulse RST2 is applied to the gate of the reset transistor Rx. In other words, the spontaneous polarization direction of the gate dielectric layer of the reset transistor Rx is changed into a spontaneous polarization direction that turns on the reset transistor Rx by applying the second reset pulse RST2. The second reset pulse RST2 may have an opposite polarity to the first reset pulse RST1. The absolute value of the signal intensity of the second reset pulse RST2 may be the same as that of the first reset pulse RST1.

In a third section t3 following the second section T2, the photocharges accumulated in the photoelectric conversion element PD are transferred to the floating diffusion node FD when the transfer signal TRF that is applied to the gate of the transfer transistor Tx is activated (i.e., the transfer transistor Tx is turned on). The bias of the gate of the drive transistor Dx is changed in proportion to the amount of the photocharges that are transferred to and accumulated in the floating diffusion node FD, and the voltage level of the source of the drive transistor Dx is changed. Herein, when the selection transistor Sx is turned on by a selection signal SEL that is applied to the gate of the selection transistor Sx, a pixel signal POUT is outputted.

As described above, as the reset transistor Rx includes the memory gate, the image sensor in accordance with the embodiment of the present invention may maintain the reset transistor Rx in the turn-on state without consuming the gate bias in the integration section of the photoelectric conversion element PD. In this way, it may be possible to suppress the increase in power consumption and prevent deterioration in image lag and SNR characteristics caused due to changes in the voltage level of the floating diffusion node FD. Also, noise caused by leakage between the memory gates of the floating diffusion node FD may be prevented from occurring.

According to an embodiment of the present invention, as a reset transistor includes a memory gate, the reset transistor may continue to be turned on without consuming gate bias during an integration section of a photoelectric conversion element. In this way, the increase in power consumption may be suppressed. Also, it may be possible to prevent image lag and signal-to-noise ratio characteristics, caused by changes in the voltage level of a floating diffusion node, deteriorating. In addition, noise caused by leakage between the memory gates of the floating diffusion node may be avoided.

While the present invention has been described with respect to specific embodiments, it will be apparent to those skilled in the art that various changes and modifications may be made without departing from the spirit and scope of the invention as defined in the following claims.

What is claimed is:

1. An image sensor, comprising:
a photoelectric conversion element suitable for generating photocharges corresponding to incident light;
a transfer transistor suitable for transferring the generated photocharges to a floating diffusion node based on a transfer signal; and
a reset transistor suitable for resetting the floating diffusion node based on an activated reset signal, wherein the reset transistor includes a memory gate,
wherein the reset transistor is kept in the turn-on state during a predetermined operation section following the resetting of the floating diffusion node even though the activated reset signal is not applied.

2. The image sensor of claim 1, wherein the memory gate maintains a turn-on state or a turn-off state of the reset transistor in an equilibrium state.

3. The image sensor of claim 2, wherein the memory gate includes a stacked structure where a gate dielectric layer and a gate electrode are stacked, and
the gate dielectric layer includes a ferroelectric substance having spontaneous polarization characteristics.

4. The image sensor of claim 2, wherein the memory gate includes a stacked structure where a tunnel insulation layer, a charge trapping layer, a charge blocking layer, and a gate electrode are sequentially stacked, and
the charge trapping layer includes a silicon layer or a nitride layer.

5. The image sensor of claim 1, wherein the memory gate turns on the reset transistor based on a first reset pulse of the reset signal, which is applied at a beginning period of the predetermined operation section, and turns off the reset transistor based on a second reset pulse of the reset signal, which is applied at an ending period of the predetermined operation section, and
the reset transistor is kept in the turn-on state during the predetermined operation section.

6. The image sensor of claim 5, wherein the predetermined operation section includes an integration section for the photoelectric conversion element.

7. The image sensor of claim 5, wherein the first reset pulse has a positive voltage level, and the second reset pulse has a negative voltage level.

8. The image sensor of claim 1, wherein the voltage level of the floating diffusion node is not changed in the predetermined operation section.

9. An image sensor, comprising:
a photoelectric conversion element suitable for generating photocharges corresponding to incident light;
a transfer transistor suitable for transferring the generated photocharges to a floating diffusion node based on a transfer signal; and
a reset transistor suitable for resetting the floating diffusion node based on a reset signal activated to a first level,
wherein the reset transistor includes a gate dielectric layer having spontaneous polarization characteristics, where a direction of spontaneous polarization of the gate dielectric layer is changed based on the reset signal,
wherein the reset transistor is kept in the turn-on state during a predetermined operation section following the resetting of the floating diffusion node even though the activated reset signal is not applied,
wherein the reset transistor is turned-off in response to a reset signal activated to a second level opposite to the first level.

10. The image sensor of claim 9, further comprising:
a drive transistor having a gate that is electrically connected to the floating diffusion node.

11. The image sensor of claim 10, wherein a gate dielectric layer of the drive transistor and a gate dielectric layer of the transfer transistor do not have spontaneous polarization characteristics.

12. The image sensor of claim 9, wherein a turn-on state or a turn-off state of the reset transistor is kept in an equilibrium state according to the direction of the spontaneous polarization.

13. The image sensor of claim 9, wherein the reset transistor is turned on as the direction of the spontaneous polarization of the gate dielectric layer is changed based on a first reset pulse of the reset signal, which is applied at a beginning period of a predetermined operation section, and
the reset transistor is turned off as the direction of the spontaneous polarization of the gate dielectric layer is changed to an opposite direction based on a second reset pulse of the reset signal, which is applied at an ending period of the predetermined operation section, and
the reset transistor is kept in the turn-on state based on the spontaneous polarization characteristics during the predetermined operation section.

14. The image sensor of claim 13, wherein the predetermined operation section includes an integration section for the photoelectric conversion element.

15. The image sensor of claim 13, wherein the first reset pulse has a positive voltage level, and the second reset pulse has a negative voltage level.

16. The image sensor of claim 9, the voltage level of the floating diffusion node is not changed in the predetermined operation section.

17. A method for operating an image sensor that includes a photoelectric conversion element suitable for generating photocharges corresponding to incident light, a transfer transistor suitable for transferring the photocharges to a floating diffusion node, a reset transistor suitable for resetting the floating diffusion node, and including a memory gate, comprising:
- turning on the reset transistor by applying a first reset pulse to the memory gate in a first section;
- allowing the incident light to impact the photoelectric conversion element during a second section following the first section, and turning off the reset transistor by applying a second reset pulse to the memory gate at an ending period of the second section; and
- turning on the transfer transistor by applying a transfer signal to a gate of the transfer transistor in a third section following the second section,
- wherein the reset transistor is kept in the turn-on state during the second section even though the first reset pulse is not applied,
- wherein the reset transistor is turned-off in response to the second reset pulse
- wherein the first reset pulse and the second reset pulse have different signal polarities.

18. The method of claim 17, wherein the memory gate maintains a turn-on state or a turn-off state of the reset transistor in an equilibrium state.

19. The method of claim 17, wherein the first reset pulse and the second reset pulse have voltage levels with absolute values that are greater than an absolute value of a voltage level of the transfer signal.

20. The method of claim 17, wherein the memory gate includes a stacked structure where a gate dielectric layer and a gate electrode are stacked, and
- the gate dielectric layer includes a ferroelectric substance having spontaneous polarization characteristics.

21. The method of claim 17, wherein the memory gate includes a stacked structure where a tunnel insulation layer, a charge trapping layer, a charge blocking layer, and a gate electrode are sequentially stacked, and
- the charge trapping layer includes a silicon layer or a nitride layer.

22. The method of claim 17, wherein the voltage level of the floating diffusion node is not changed in the second section.

* * * * *